United States Patent
Yokoi et al.

(10) Patent No.: US 11,064,641 B2
(45) Date of Patent: Jul. 13, 2021

(54) COMPONENT MOUNTING MACHINE

(71) Applicant: FUJI CORPORATION, Chiryu (JP)

(72) Inventors: Yuta Yokoi, Kariya (JP); Hiroshi Oike, Chiryu (JP); Takahiro Kobayashi, Chiryu (JP); Keiichi Ono, Anjo (JP)

(73) Assignee: FUJI CORPORATION, Chiryu (JP)

( * ) Notice: Subject to any disclaimer, the term of this patent is extended or adjusted under 35 U.S.C. 154(b) by 70 days.

(21) Appl. No.: 16/480,108

(22) PCT Filed: Jan. 30, 2017

(86) PCT No.: PCT/JP2017/003216
§ 371 (c)(1),
(2) Date: Jul. 23, 2019

(87) PCT Pub. No.: WO2018/138921
PCT Pub. Date: Aug. 2, 2018

(65) Prior Publication Data
US 2019/0380238 A1    Dec. 12, 2019

(51) Int. Cl.
*G06K 9/00* (2006.01)
*H05K 13/08* (2006.01)
*G06T 7/70* (2017.01)
*H05K 13/04* (2006.01)

(52) U.S. Cl.
CPC ..... *H05K 13/0813* (2018.08); *G06K 9/00664* (2013.01); *G06T 7/70* (2017.01); *H05K 13/0409* (2018.08); *H05K 13/0818* (2018.08)

(58) Field of Classification Search
None
See application file for complete search history.

(56) References Cited

U.S. PATENT DOCUMENTS 5,384,000 A * 1/1995 Nishiguchi ........... H01L 21/681
156/297

FOREIGN PATENT DOCUMENTS

| JP | 2005-166850 A | 6/2005 |
| JP | 2007-142039 A | 6/2007 |
| JP | 4804295 B2 | 11/2011 |

OTHER PUBLICATIONS

International Search Report dated May 9, 2017 in PCT/JP2017/003216 filed Jan. 30, 2017.

* cited by examiner

*Primary Examiner* — Atiba O Fitzpatrick
(74) *Attorney, Agent, or Firm* — Oblon, McClelland, Maier & Neustadt, L.L.P.

(57) ABSTRACT

A component mounting machine including a camera configured to capture an image of a component held by a suction nozzle; and an image processing section configured to process the image captured by the camera, recognize the shape of the component, and measure shape data of the component; wherein, when the deviation amount of the measurement value of the shape data of the component exceeds the allowable value, the deviation amount of the measurement value of the shape data of the component is compared to a retry determination that is larger than the allowance value, and if the deviation amount of the measurement value of the shape data of the component exceeds the retry determination value, the component is determined to be abnormal and is discarded to a specified discard location.

7 Claims, 4 Drawing Sheets

COMPONENT MOUNTING MACHINE

TECHNICAL FIELD

The present application relates to a component mounting machine provided with a function for determining whether a component is normal or abnormal by processing an image captured by a camera of the component held by a suction nozzle.

BACKGROUND ART

Conventionally, component mounting machines, as disclosed for example in patent literature 1 (JP-A-2005-166850) and patent literature 2 (JP-A-2007-142039), use a camera to capture an image from below of a component held by a suction nozzle, process the image to recognize the shape of the component, measure the shape data of the component (for example, for a leaded component, lead length, lead pitch, lead width, lead bend, component body dimensions in X and Y, and so on), compare the measurement values with imaging processing component shape data created in advance, and based on whether the deviation amount of the measurement values is within a predetermined allowance value (tolerance), determine the component to be normal (mounting possible) or abnormal (mounting not possible), then mount components determined to be normal on a circuit board, and discard components determined to be abnormal to a specified discard location.

Further, in patent literature 1, if the quantity of leads recognized in the image differs from the quantity of leads set in the image processing component shape data, the edge determining threshold value used for performing image recognition of the edges of leads is adjusted, and detection processing of the leads is performed again (retry image processing).

CITATION LIST

Patent Literature

PTL 1: JP-A-2005-166850
PTL 2: JP-A-2007-142039

BRIEF SUMMARY

Technical Problem

However, when performing image recognition of the shape of the component to measure the shape data, there are unavoidable measurement variances that arise due to image processing. Thus, even for a component for which the actual deviation amount (dimensional tolerance) is within the allowable amount, if the deviation amount of the measurement value exceeds the allowable amount due to measurement variance in image processing, the component may be incorrectly determined as abnormal and discarded. Among electronic components mounted on circuit boards, because there are expensive components, reducing the quantity of discarded components contributes to reducing costs. Considering this, it is desirable to perform discarding after determining whether a component for which the actual deviation amount is within the allowable amount was determined to be abnormal due to the measurement tolerance of image processing.

With regard to this point, when the deviation amount of the measurement value of shape data of the component is determined to exceed the allowable amount, as in patent literature 1, one may consider changing image processing parameters such as an edge determination threshold and then retrying image processing.

However, because image processing parameters are optimized along with imaging conditions and the like before production, if the image processing parameters are changed and retry image processing is performed, the measurement variance may actually increase, which may result in a component for which the actual deviation amount exceeds the allowable amount being incorrectly determined as a normal component for which the deviation amount of the measurement value is within the allowable amount due to measurement variance of the retry image processing, thereby worsening product quality and reliability.

Further, if retry image processing is performed many times for all the components for which it is determined that the deviation amount of the measurement value exceeds the allowable amount, the time required for image processing is long, the cycle time increases, and productivity is lowered.

Solution to Problem

To solve the above problems, disclosed is a machine including: a camera configured to capture an image of a component held by a suction nozzle; an image processing section configured to process the image captured by the camera, recognize a shape of the component, and measure shape data of the component; and a control section configured to control operation of mounting the component on a circuit board in a case of determining that the component is normal based on whether a deviation amount of a measurement value of the shape data of the component is within a specified allowable value by comparing the measurement value of the shape data of the component measured by the image processing section with image-processing-use component shape data, wherein the control section is configured to compare the deviation amount of the measurement value of the shape data of the component when the deviation amount of the measurement value of the shape data of the component exceeds the allowable value to a retry determination value that is larger than the allowable value, and (1) determine the component is abnormal and discard the component to a specified discard location if the deviation amount of the measurement value of the shape data of the component exceeds the retry determination value, and (2) if the deviation amount of the measurement value of the shape data of the component is equal to or less than the retry determination value, perform retry image processing of capturing an image of the component held by the suction nozzle again using the camera, remeasuring the shape data of the component, and determining whether the component is normal based on whether the deviation of the new measurement value is equal to or less than the allowable value. Here, the retry determination value, for example, may be set to a value larger than the allowable value by an amount equivalent to a maximum measurement variance of image processing, or to a value larger than that.

That is, if the deviation amount of the measurement value of the shape data of the component exceeds the retry determination value that is larger than the allowable value, the deviation amount of the measurement value of the shape data of the component is larger than the allowable value by at least an amount equivalent to the maximum measurement variance of image processing, therefore, the actual deviation amount (dimensional tolerance) of the shape data of the component can be determined to exceed the allowable value.

Accordingly, in this case, the component can be determined to be abnormal without performing retry image processing and can be discarded, which prevents image processing time from being extended due to unnecessary retry image processing, thereby preventing the cycle time from being increased (productivity from being lowered).

In contrast, if the deviation amount of the measurement value of the shape data of the component is equal to or less than the retry determination value, it is possible that the deviation amount of the measurement value of the shape data of the component exceeds the allowable value because of image processing measurement variance, therefore, retry image processing is performed such that an image of the component held by the suction nozzle is captured by the camera again, the shape data of the component is remeasured, and it is determined whether the deviation amount of that measurement value is equal to or less than the allowable value, and, if the deviation amount of the measurement value is equal to or less than the allowable value, the component is determined to be normal and is mounted on the circuit board. Accordingly, it is possible to reduce the possibility that a component for which the actual deviation amount (dimensional tolerance) is equal to or less than the allowable value is mistakenly discarded by being determined to be abnormal due to image processing measurement variance, which reduces the quantity of discarded components, thereby realizing cost reductions.

In this case, retry image processing may be performed only once, or may be performed twice or more. For example, retry image processing may be performed again if the deviation amount of the measurement value of the shape data of the component measured again in the retry image processing is equal to or less than the retry determination value even if the deviation amount exceeds the allowable value, and the component determined to be abnormal if the component is not determined to be normal after performing the retry image processing a specified number of times, then the component discarded to the specified discard location. Accordingly, it is possible to further reduce the possibility that a component for which the actual deviation amount (dimensional tolerance) is equal to or less than the allowable value is mistakenly discarded by being determined to be abnormal due to image processing measurement variance, which reduces the quantity of discarded components, thereby realizing cost reductions.

Here, the maximum number of times to perform retry image processing (specified number of times) may be a predetermined fixed number of times, or may be entered manually into the control section by an operator.

Also, the retry determination value may be a predetermined fixed value or may be entered manually into the control section by an operator.

Also, in a case in which retry image processing is performed twice or more, the same retry determination value may be used each time, or considering the fact that the possibility of the component being determined as normal decreases every time the number of times retry image processing is performed increases, the retry determination value may be changed each time the number of times retry image processing is performed increases such that the difference with the allowable value is smaller, and the retry determination value may be returned to its original value after completing determination of whether the component is normal or abnormal.

Further, in a case in which retry image processing is performed, the conditions for imaging the component (camera shutter speed and/or lighting conditions) may be the same as conditions when imaging was performed initially. This is because if conditions for imaging the component are changed, the way the component shows up in the image may change, leading to the measurement value of the shape data from image processing changing.

The allowable value and the retry determination value may be set in the image-processing-use component shape data. Accordingly, it is easy to manage a link between the allowable value and retry determination value and the image-processing-use component shape data for each component.

DESCRIPTION OF EMBODIMENTS

Figure 1:
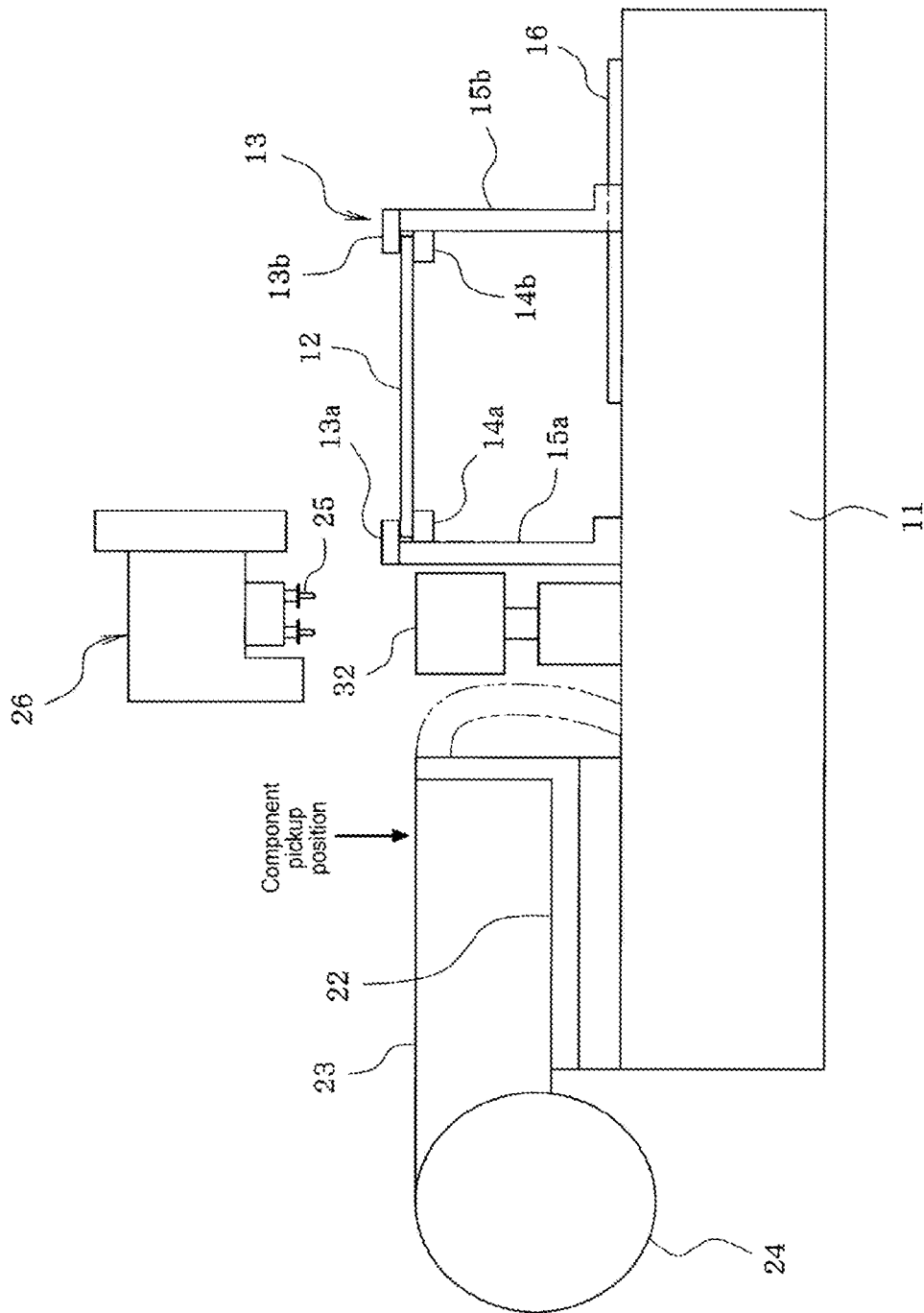
FIG. 1 is a side view illustrating the configuration of a component mounting machine of an embodiment.

An embodiment is described below with reference to the figures. First, the configuration of a component mounting machine will be described based on FIG. 1.

Conveyor 13 that conveys circuit board 12 is provided on base 11 of the component mounting machine (below, the conveyance direction of circuit board 12 by conveyor 13 is referred to as the X direction, and the direction perpendicular to that is referred to as the Y direction). Of support members 15a and 15b that support the two conveyor rails 13a and 13b and conveyor belts 14a and 14b that configure conveyor 13, support member 15a is fixed at a specified position, with the support member 15b on the opposite side being adjusted in the Y direction along guide rail 16 by a screw mechanism (not shown) or the like such that the width of conveyor 13 (the gap between conveyor rails 13a and 13b) is adjustable to the width of circuit board 12.

Also, feeder setting table 22 is provided to the side of conveyor 13 on base 11, with multiple feeders 23 being removably set on feeder setting table 22 in the Y direction. Set on each feeder 23 is a reel 24 on which is wound component supply tape housing many components at a fixed pitch, with the reel being set such that the leading component of the component supply tape pulled from the reel 24 is positioned at a component pickup position (position at which the component is picked up by suction nozzle 25).

The component mounting machine is provided with head moving device 27 (refer to FIG. 2) for moving mounting head 26 in the following order: component pickup position->component imaging position->component mounting position. One or multiple suction nozzles 25 that pick up a component fed by a feeder to the component pickup position are held on mounting head 26 facing downwards, and the suction nozzle 25 is lowered and raised during component pickup operation and component mounting operation. Also, the component mounter is provided with mark imaging camera 31 (refer to FIG. 2) that is moved together with mounting head 24 and that images from above reference marks or the like provided on circuit board 12, and component imaging camera 32 that images from below a component held by suction nozzle 25. Component imaging camera 32 is fixed facing upwards in a space between conveyor 13 and feeder setting table 22 on base 11.

Figure 2:
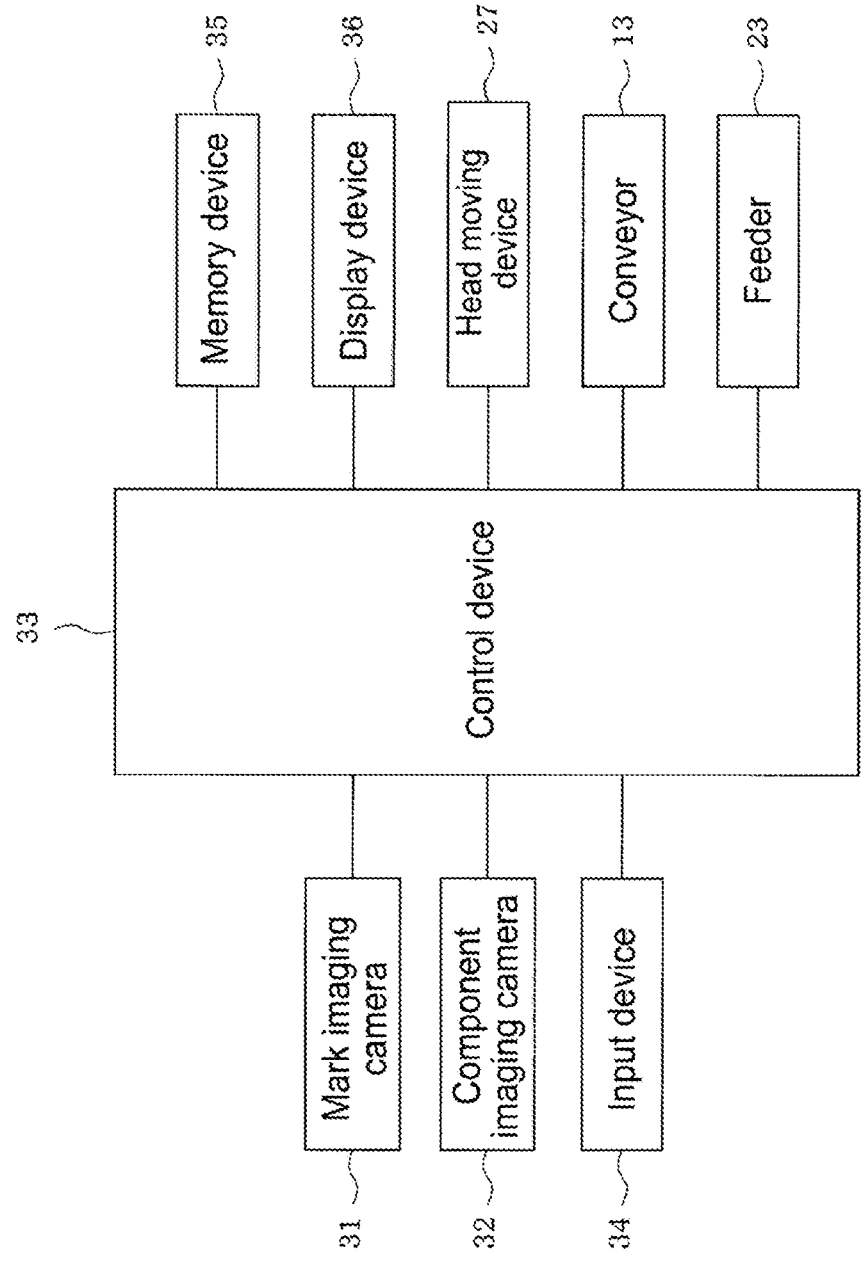
FIG. 2 is a block diagram showing the configuration of control items of a component mounting machine.

As shown in FIG. 2, connected to control device 33 (control section) of the component mounter are: input device 34 such as a keyboard, mouse, or touchscreen panel; memory device 35 such as a hard disk, RAM, or ROM that memorizes items such as a component mounting machine control program of FIG. 4 that is described later and component shape data for image processing; and display device 36 such as a liquid crystal display or CRT.

Control device 33 of the component mounting machine is configured mainly from a computer and functions as a control section that controls each operation of the component mounting machine, and as an image processing section that processes images captured by mark imaging camera 31 and component imaging camera 32.

Control device 33 of the component mounting machine uses mark imaging camera 31 to image from above reference marks of circuit board 12 that is clamped having been conveyed to a specified position by conveyor 13 and recognizes the reference marks, then measures each component mounting position on circuit board 12 based on the positions of the reference marks, and moves mounting head 26 in the order of component pickup position, component imaging position, component mounting position, causes suction nozzle 25 of mounting head 26 to pick up a component supplied by feeder 23, uses component imaging camera 32 to image the component, and processes the captured image to recognize the shape of the component and measure the component shape data. Here, component shape data refers to, for example, for a leaded component, lead length, lead pitch, lead width, lead bend, lead position in X and Y directions, component body dimensions in X and Y directions, and the like, or for a BGA component, ball diameter, ball pitch, ball position in X and Y directions, component body dimensions in X and Y directions, and the like.

Control device 33 of the component mounting machine, by performing the component mounting machine control program of FIG. 4 described later, compares a measurement value of component shape data measured by image processing with image processing component shape data created in advance, determines whether the component is normal (mountable) based on whether the deviation amount of all the measurement values of the shape data is equal to or less than a predetermined allowance value (tolerance), and mounts a component determined to be normal on the circuit board. Here, a deviation amount of a measurement value of the component shape data is an absolute value of the difference between the measurement value and the image processing component shape data.

Deviation amount of measurement value=|measurement value−image processing component shape data|

Here, image processing component shape data is created in advance using component CAD data or production specifications, or an image of a component can be processed by an image processing component shape data creation system, the shape data measured, and that data used as the image processing component shape data.

Figure 3:
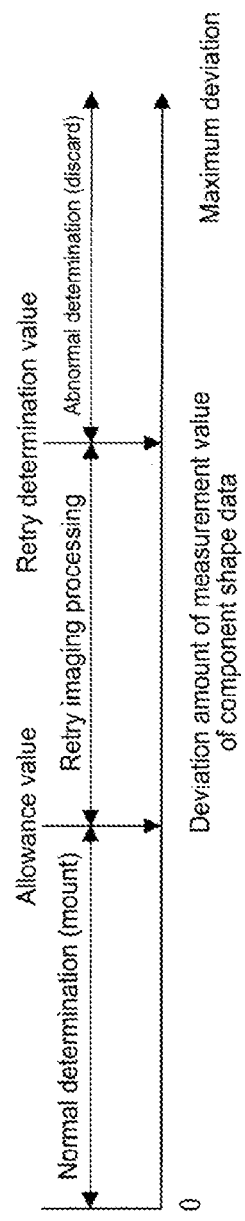
FIG. 3 shows the relationship between the determination of a component as normal or abnormal by image processing, retry image processing, and the allowable value and retry determination value.

On the other hand, control device 33 of the component mounting machine, in a case in which the deviation amount of the measurement value of any of the shape data of the component exceeds the allowance value, compares the deviation amount of the measurement value of the shape data with a retry determination value (refer to FIG. 3) larger than the allowance value. Here, the retry determination value, for example, is set to a value larger than the allowable value by an amount equivalent to a maximum measurement variance of image processing, or to a value larger than that. Accordingly, control device 33 of the component mounting machine determines a component to be abnormal if the deviation amount of the measured value of the component shape data exceeds the retry determination value, and discards the component to a specified discard location. That is, if the deviation amount of the measurement value of the shape data of the component exceeds the retry determination value that is larger than the allowable value, the deviation amount of the measurement value of the shape data of the component is larger than the allowable value by at least an amount equivalent to the maxim measurement variance of image processing, therefore, the actual deviation amount (dimensional tolerance) of the shape data of the component can be determined to exceed the allowable value. Accordingly, in this case, the component can be determined to be abnormal without performing retry image processing and can be discarded, which prevents image processing time from being extended due to unnecessary retry image processing, thereby preventing the cycle time from being increased (productivity from being lowered).

In contrast, control device 33 of the component mounting machine, if the deviation amount of the measurement value of the component shape data is equal to or less than the retry determination value, performs retry imaging processing in which camera 32 captures an image of the component held by suction nozzle 25 again, the component shape data is remeasured, and it is determined whether the component is normal based on whether the remeasured value is equal to or less than the allowance value. That is, if the deviation amount of the measurement value of the shape data of the component is equal to or less than the retry determination value, it is possible that the deviation amount of the measurement value of the shape data of the component exceeds the allowable value because of image processing measurement variance, therefore, retry image processing is performed such that an image of the component held by the suction nozzle is captured by camera 32 again, the shape data of the component is remeasured, and it is determined whether the deviation amount of that measurement value is equal to or less than the allowable value, and, if the deviation amount of the measurement value is equal to or less than the allowable value, the component is determined to be normal and is mounted on the circuit board 12. Accordingly, it is possible to reduce the possibility that a component for which the actual deviation amount (dimensional tolerance) is equal to or less than the allowable value is mistakenly discarded by being determined to be abnormal due to image processing measurement variance, which reduces the quantity of discarded components, thereby realizing cost reductions.

In this case, the quantity of times for performing (retry quantity) retry image processing may be one, but in the present embodiment, control device 33 of the component mounting machine performs retry image processing again if the deviation amount of the measurement value of the shape data of the component measured again in the retry image processing is equal to or less than the retry determination value even if the deviation amount exceeds the allowable value, and the component is determined to be abnormal if the component is not determined to be normal after performing the retry image processing a specified number of times, then the component discarded to the specified discard location. Accordingly, it is possible to further reduce the possibility that a component for which the actual deviation amount (dimensional tolerance) is equal to or less than the allowable value is mistakenly discarded by being determined to be abnormal due to image processing measurement variance, which reduces the quantity of discarded components, thereby realizing cost reductions. Note that, a component is determined to be abnormal if the deviation amount of the measurement value of the component shape data exceeds the retry determination value, and the component is then discarded to a specified discard location.

Here, the maximum number of times to perform retry image processing (specified number of times) may be a predetermined fixed number of times, or may be entered manually into control device 33 by an operator operating input device 34.

Also, the retry determination value may be a predetermined fixed value or may be entered manually into control device 33 by an operator operating input device 34. As described above, the retry determination value may be set to a value larger than the allowable value by an amount equivalent to a maximum measurement variance of image processing, or to a value larger than that, for example, the retry determination value may be set based on the allowance value itself, such as that a value 20% (specified %) larger than the allowance value may be set as the retry determination value.

Also, in a case in which retry image processing is performed twice or more, the same retry determination value may be used each time, or considering the fact that the possibility of the component being determined as normal decreases every time the number of times retry image processing is performed increases, the retry determination value may be changed each time the number of times retry image processing is performed increases such that the difference with the allowable value is smaller, and the retry determination value may be returned to its original value after completing determination of whether the component is normal or abnormal.

Further, in a case in which retry image processing is performed, the conditions for imaging the component (camera 32 shutter speed and/or lighting conditions) are the same as conditions when imaging was performed initially. This is because if conditions for imaging the component are changed, the way the component shows up in the image may change, leading to the measurement value of the shape data from image processing changing.

The allowance value and the retry determination value may be set in the production job (production program), but in the present embodiment the allowance value and the retry determination value are set in the image processing component shape data. Accordingly, it is easy to manage a link between the allowable value and retry determination value and the image-processing-use component shape data for each component.

Control of component imaging operation in the embodiment described above is performed as follows by control device 33 of the component mounting machine performing the component mounting machine control program of FIG. 4.

Figure 4:
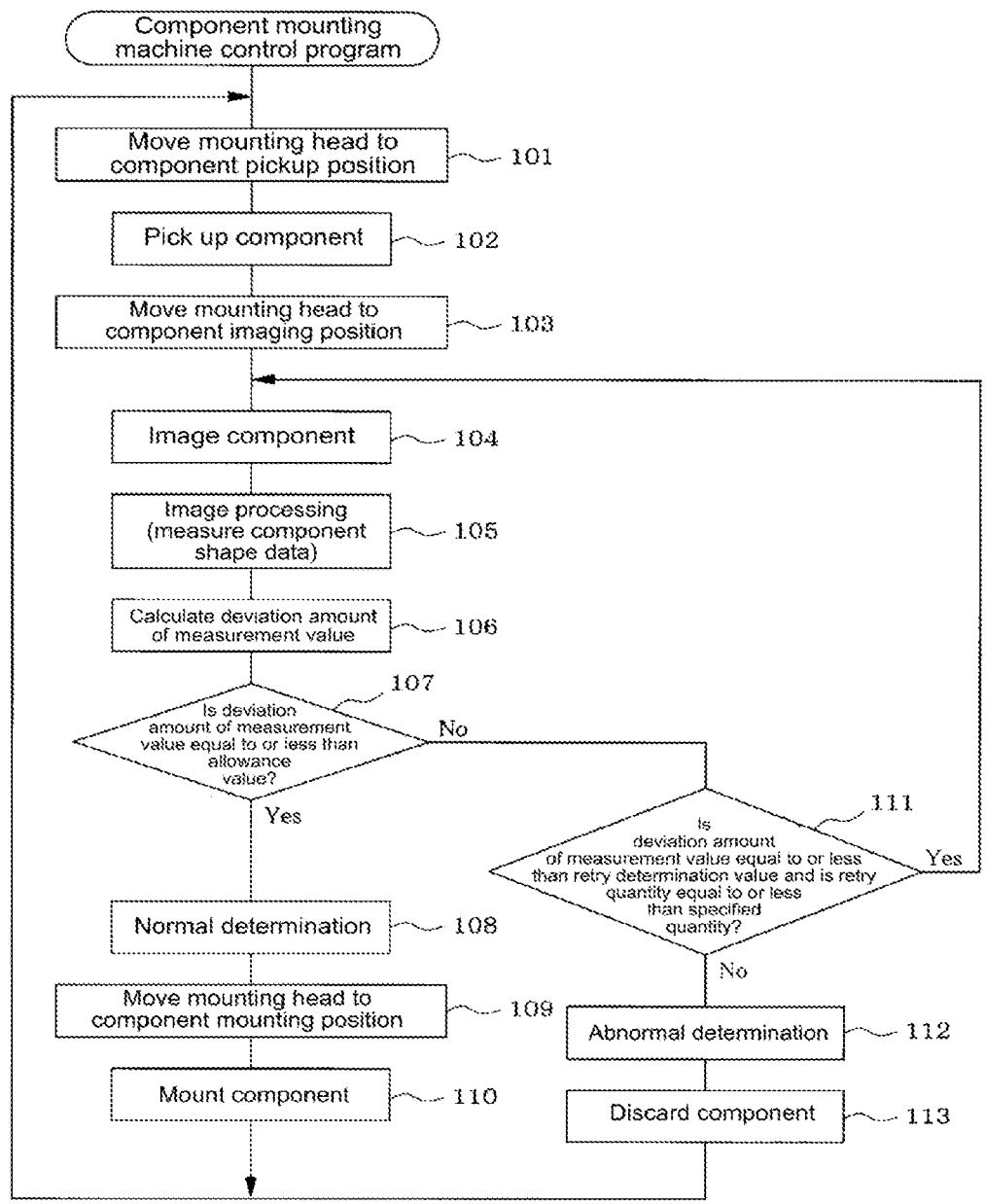
FIG. 4 is a flowchart showing the flow of processing of a component mounting machine control program.

The component mounting machine control program of FIG. 4 is performed when production is started, and first, in step 101, mounting head 26 is moved to the component pickup position, then, in step 102, suction nozzle 25 is lowered, and a component supplied by feeder 23 is picked up by suction nozzle 25. Next, in step 103, mounting head 26 is moved to the component imaging position, then, in step 104, the component held by suction nozzle 25 is imaged by component imaging camera 32. Next, in step 105, the image captured by camera 32 is processed to recognize the shape of the component and measure the component shape data, then, in step 106, the measurement value of the component shape data is compared to the image processing component shape date, and the deviation amount of the measurement value of the component shape data is calculated.

Then, in step 107, it is determined whether the deviation amount of the measurement value of the component shape data is equal to or less the allowance value, and if the deviation amount of the measurement value of the component shape data is equal to or less the allowance value, in step 108, the component is determined to be normal, processing continues to step 109 wherein mounting head 26 is moved to the component mounting position, then, in step 110, the component held by suction nozzle 25 is mounted on circuit board 12, then processing returns to step 101 and the above operation is repeated.

On the other hand, in step 107, if the deviation amount of the measurement value of the component shape data exceeds the allowance value, processing continues to step 111 wherein it is determined whether the deviation amount of the measurement value of the component shape data is equal to or less the retry determination value and it is determined whether the retry quantity for which retry image processing has been performed is equal to or less than a specified quantity. If it is determined that the deviation amount of the measurement value of the component shape data is equal to or less the retry determination value and it is determined that the retry quantity is equal to or less than a specified quantity, the processing of steps 104 to 107 above is repeated. Thus, retry imaging processing is performed, camera 32 captures an image of the component held by suction nozzle 25 again, the component shape data is remeasured, and it is determined whether the remeasured value is equal to or less than the allowance value.

By this retry image processing, if the deviation amount of the measurement value of the component shape data is determined to be equal or less than the allowance value, the component is determined to be normal, then the processing of steps 108 to 110 is performed with mounting head 26 being moved to the component mounting position and the component held by suction nozzle 25 being mounted on circuit board 12, then processing returns to step 101 and the above operation is repeated.

On the other hand, in step 111, if the deviation amount of the measurement value of the component shape data is determined to exceed the retry determination value, or if the retry quantity is determined to exceed the specified quantity, processing proceeds to step 112 and the component is determined to abnormal, then, in step 113, the component is discarded to the specified discard location, processing returns to step 101, and the above operation is repeated.

According to an embodiment described above, the deviation amount of the measurement value of the component shape data measured using image processing is compared to the retry determination value that is larger than the allowance value, and the component is determined to be abnormal if the deviation amount of the measurement value of the component shape data exceeds the retry determination value and is then discarded to the specified discard location, thus, by determining whether the deviation amount of the measurement value of the component shape data exceeds the retry determination value that is larger than the allowance value, in a case in which it is determined that the deviation amount of the measurement value of the component shape data exceeds the allowance value, the component is determined to be abnormal and is discarded without performing retry image processing, and, by this, extending the time required for image processing by unnecessary retry image processing being performed is prevented, and delays in the cycle time (lowering of productivity) are prevented.

Further, if the deviation amount of the measurement value of the shape data of the component is equal to or less than the retry determination value, it is determined that it is possible that the deviation amount of the measurement value of the shape data of the component exceeds the allowable value because of image processing measurement variance, therefore, retry image processing is performed such that an image of the component held by the suction nozzle is captured by camera 32 again, the shape data of the component is remeasured, and it is determined whether the deviation amount of that measurement value is equal to or less than the allowable value, thus, for a component for which the actual deviation amount is within the allowable value, it is possible to reduce the possibility that the component will be incorrectly discarded due to being determined as abnormal due to measurement variance of image processing, which reduces the quantity of discarded components, thereby saving costs.

Note that, in an embodiment above, component imaging camera 32 that images components held by suction nozzle 25 is fixed on base 11 of the component mounting machine, but a camera for imaging components held by suction nozzle 25 may be attached to mounting head 26, and the camera may image the component while the component held by the suction nozzle 25 is moved to the component mounting position.

Note that, the present disclosure is not limited to embodiments described above and it goes without saying that various embodiments with changes that do not extend beyond the scope of the disclosure are possible, such as that suitable changes may be made to the configuration of the component mounting machine.

REFERENCE SIGNS LIST

12: circuit board;
13: conveyor;
23: feeder;
25: suction nozzle;
26: mounting head;
27: head moving device;
32: component imaging camera;
33: control device (control section, image processing section)

The invention claimed is:

1. A component mounting machine comprising:
a camera configured to capture a first image of a component held by a suction nozzle;
an image processing section configured to process the first image captured by the camera, recognize a shape of the component, and measure shape data of the component; and
a control section configured to control operation of mounting the component on a circuit board in a case of determining that the component is normal based on whether a deviation amount of a measurement value of the shape data of the component is within a specified allowable value by comparing the measurement value of the shape data of the component measured by the image processing section with image-processing-use component shape data, the control section is configured to
when the deviation amount of the measurement value of the shape data of the component exceeds the specified allowable value, compare the deviation amount of the measurement value of the shape data of the component to a retry determination value that is larger than the specified allowable value, determine the component is abnormal and discard the component to a specified discard location when the deviation amount of the measurement value of the shape data of the component exceeds the retry determination value, and when the deviation amount of the measurement value of the shape data of the component is equal to or less than the retry determination value, perform retry image processing of capturing a second image of the component held by the suction nozzle using the camera, measuring a second shape data of the component based on the second image, and determining whether the component is normal based on whether a second deviation amount, obtained by comparing a measurement value of the second shape data of the component with the image-processing-use component shape data, is equal to or less than the specified allowable value.

2. The component mounting machine according to claim 1, wherein
the control section is configured to repeat the retry image processing when the second deviation amount of the measurement value of the shape data of the component measured in the retry image processing is equal to or less than the retry determination value and the second deviation amount exceeds the specified allowable value, and determine that the component is abnormal if the component is not determined to be normal after performing the retry image processing a specified number of times, then discard the component to the specified discard location.

3. The component mounting machine according to claim 2, wherein
the control section is configured to allow an operator to manually enter a maximum number of times that retry image processing is to be performed.

4. The component mounting machine according to claim 1, wherein
the control section is configured to allow an operator to manually enter the retry determination value.

5. The component mounting machine according to claim 1, wherein
the control section is configured to change the retry determination value every time a number of times retry image processing is performed increases such that a difference with the specified allowable value is smaller, and return the retry determination value to an original value after completing determination of whether the component is normal or abnormal.

6. The component mounting machine according to claim 1, wherein
the control section is configured to, when performing the retry image processing, make conditions for imaging the second image the same as conditions when imaging the first image.

7. The component mounting machine according to claim 1, wherein
the specified allowable value and the retry determination value are set in the image-processing-use component shape data.

* * * * *